(12) United States Patent
Sankaran

(10) Patent No.: US 7,376,813 B2
(45) Date of Patent: May 20, 2008

(54) REGISTER MOVE INSTRUCTION FOR SECTION SELECT OF SOURCE OPERAND

(75) Inventor: Jagadeesh Sankaran, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 504 days.

(21) Appl. No.: 11/072,777

(22) Filed: Mar. 4, 2005

(65) Prior Publication Data

US 2005/0203928 A1 Sep. 15, 2005

Related U.S. Application Data

(60) Provisional application No. 60/550,940, filed on Mar. 4, 2004.

(51) Int. Cl.
*G06F 9/312* (2006.01)

(52) U.S. Cl. .......................................... 712/208; 712/24

(58) Field of Classification Search ................. 712/208, 712/24
See application file for complete search history.

(56) References Cited

U.S. PATENT DOCUMENTS 5,862,063 A * 1/1999 Thome et al. .............. 708/290
6,219,777 B1 * 4/2001 Inoue ........................... 712/23
6,629,232 B1 * 9/2003 Arora et al. .................. 712/29
6,678,710 B1 * 1/2004 Shankar et al. ............. 708/517
2002/0035678 A1 * 3/2002 Rice et al. ................... 712/223

* cited by examiner

*Primary Examiner*—Eric Coleman
(74) *Attorney, Agent, or Firm*—Robert D. Marshall, Jr.; W. James Brady; Frederick J. Telecky, Jr.

(57) ABSTRACT

A data processing apparatus execution unit includes a multiplexer having inputs receiving data from sections of a source data register or registers. The multiplexer selects data from one section to store in a destination data register. The execution unit may zero extend or sign extend the remaining most significant bits of the destination data. In an alternative embodiment, the execution unit includes plural multiplexers, one for each section of the destination data. Each multiplexer received data from each section of the source data register or registers. Special codes in the sections of the second source data register may select 0 fill, 1 fill or sign extension from the next most significant section for each multiplexer.

29 Claims, 12 Drawing Sheets

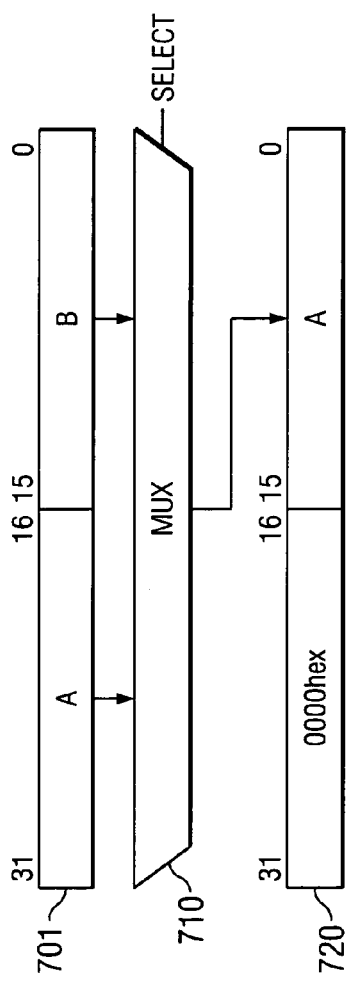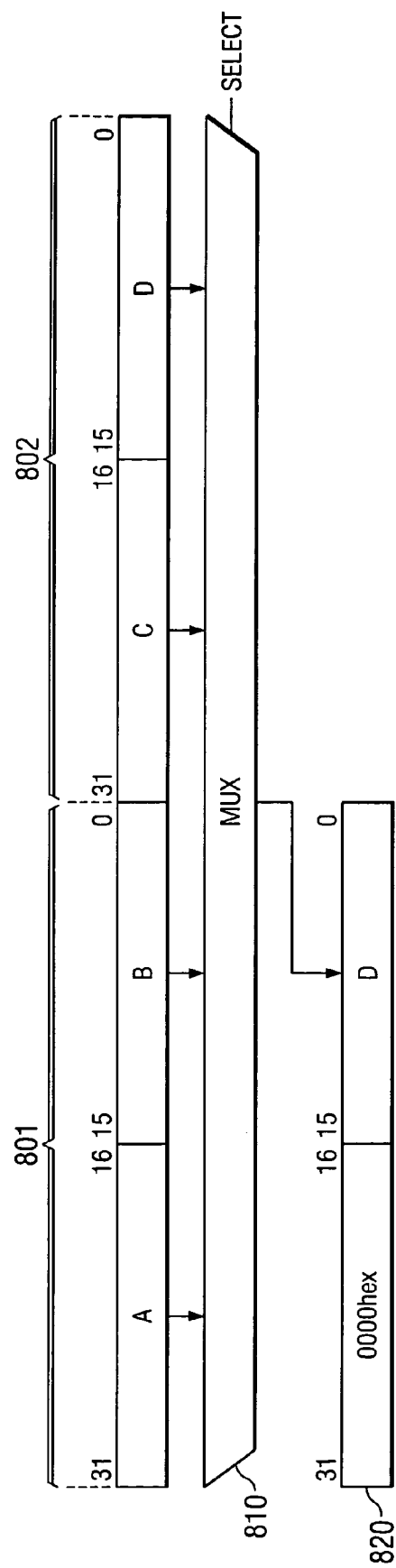
FIG. 7
FIG. 8

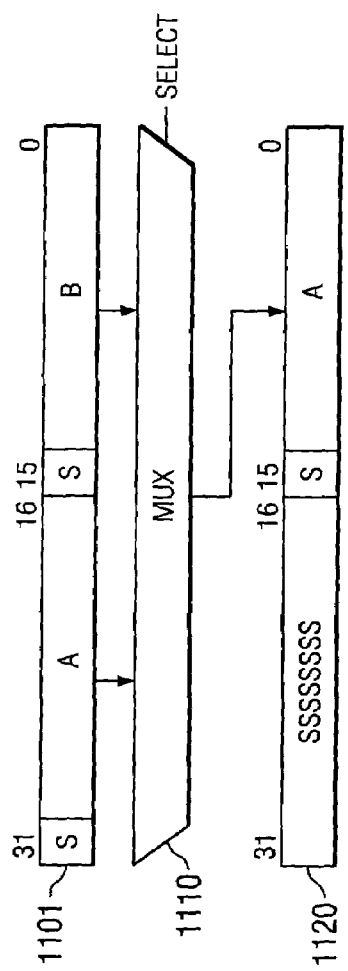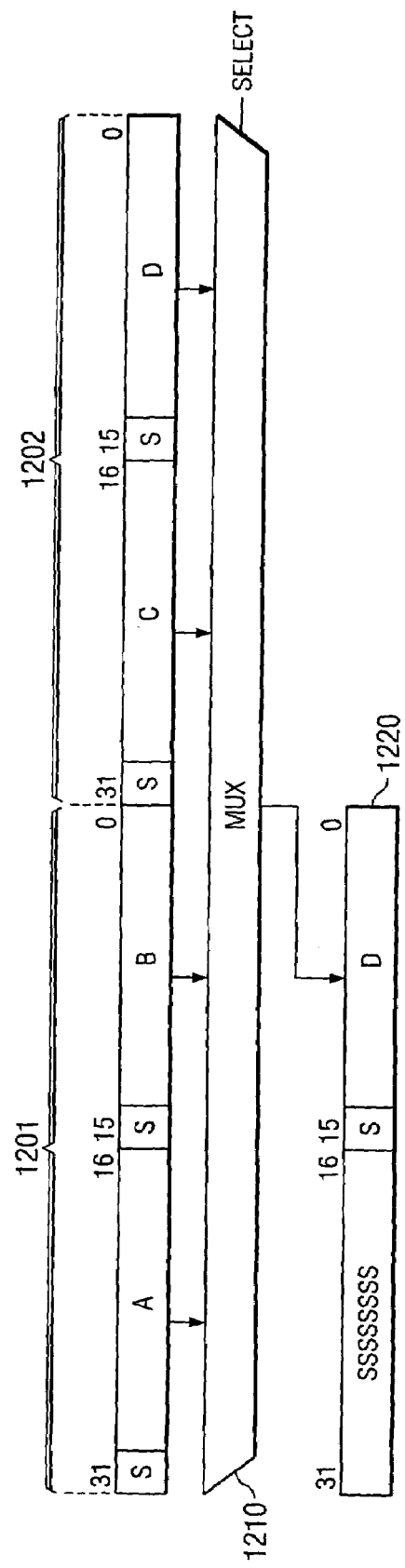

|  | 1821 | | | | 1822 | | | |
|---|---|---|---|---|---|---|---|---|
| 1801 | A0 | A1 | A2 | A3 | A4 | A5 | A6 | A7 |
| 1802 | B0 | B1 | B2 | B3 | B4 | B5 | B6 | B7 |
| 1803 | C0 | C1 | C2 | C3 | C4 | C5 | C6 | C7 |
| 1804 | D0 | D1 | D2 | D3 | D4 | D5 | D6 | D7 |
| 1805 | E0 | E1 | E2 | E3 | E4 | E5 | E6 | E7 |
| 1806 | F0 | F1 | F2 | F3 | F4 | F5 | F6 | F7 |
| 1807 | G0 | G1 | G2 | G3 | G4 | G5 | G6 | G7 |
| 1808 | H0 | H1 | H2 | H3 | H4 | H5 | H6 | H7 |
| 1809 | I0 | I1 | I2 | I3 | I4 | I5 | I6 | I7 |
| 1810 | J0 | J1 | J2 | J3 | J4 | J5 | J6 | J7 |

*FIG. 18*

| | | | | | | | | |
|---|---|---|---|---|---|---|---|---|
| 1901 | A0 | A1 | A2 | A3 | A4 | A5 | A6 | A7 |
| 1902 | B0 | B1 | B2 | B3 | B4 | | | |
| 1903 | C0 | C1 | C2 | C3 | C4 | C5 | C6 | |
| 1904 | D0 | D1 | D2 | D3 | D4 | | | |
| 1905 | E0 | E1 | E2 | E3 | E4 | E5 | E6 | E7 |
| 1906 | F0 | F1 | | | | | | |
| 1907 | G0 | G1 | G2 | G3 | | | | |
| 1908 | H0 | H1 | H2 | H3 | H4 | H5 | H6 | |
| 1909 | I0 | I1 | I2 | I3 | I4 | I5 | I6 | I7 |
| 1910 | J0 | J1 | J2 | J3 | | | | |

*FIG. 19*

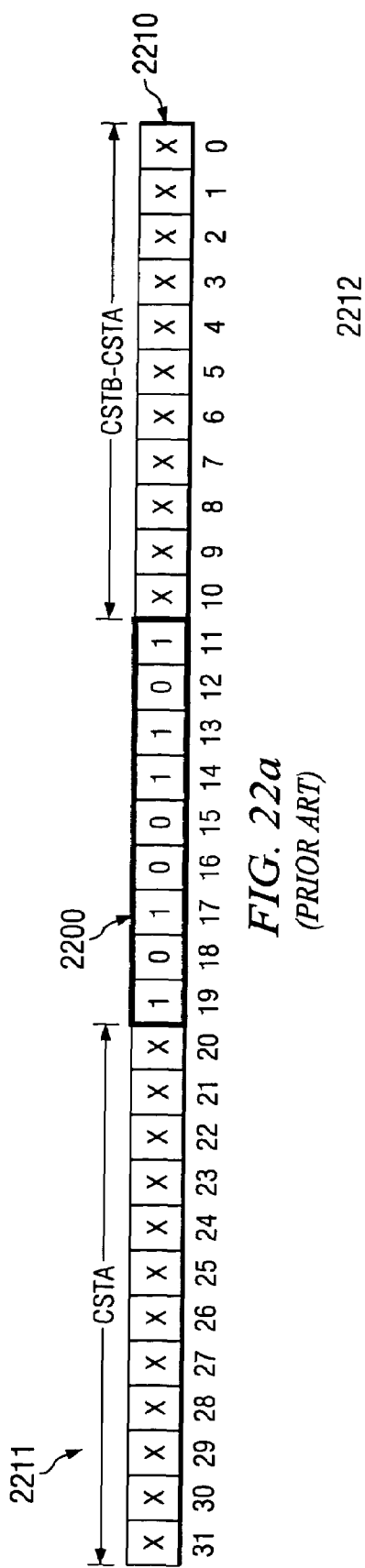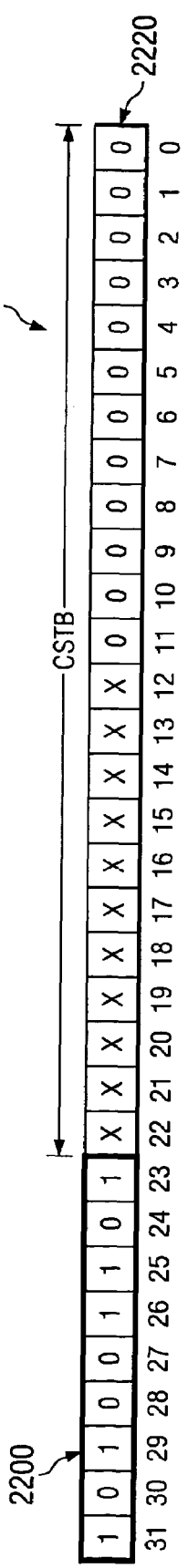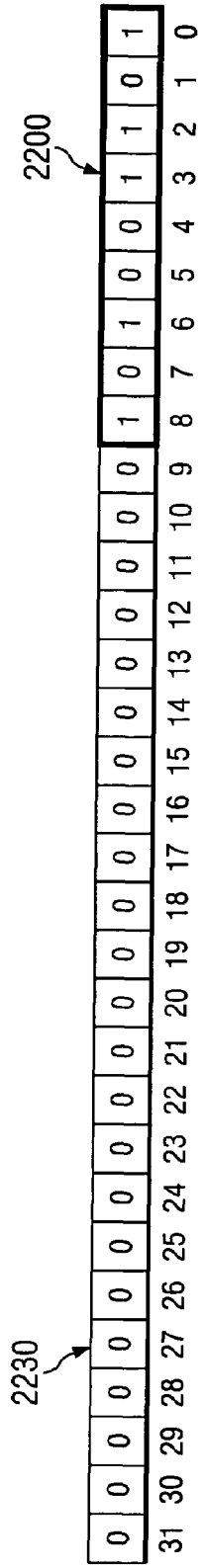
FIG. 22a (PRIOR ART)
FIG. 22b (PRIOR ART)
FIG. 22c (PRIOR ART)

REGISTER MOVE INSTRUCTION FOR SECTION SELECT OF SOURCE OPERAND

CLAIM OF PRIORITY

This application claims priority under 35 U.S.C. 119(e) from U.S. Provisional Application 60/550,940 filed Mar. 4, 2004.

TECHNICAL FIELD OF THE INVENTION

The technical field of this invention is digital computing and more particularly very long instruction word (VLIW) computing.

BACKGROUND OF THE INVENTION

Many current data processing algorithms, such as entropy coding, repeatedly use large look up tables with the values included in these tables determined at run time. Entropy coding is a data compression technique that employs fewer coded bits for more frequently used symbols than for less frequently used symbols. In the prior art the complete index for the look up table element was calculated before the memory access to the look up table. Current data processors have long latencies for memory access relative to the data processor operation even for accesses that hit into a cache. This long memory access latency worsens the performance for algorithms that are lookup table intensive.

In many cases the desired look up table entry is defined by a coarse index that can be quickly determined and a fine index indicating an offset from the coarse index. This occurs because the entropy statistics define an inherently jagged table. In such a jagged table the coarse index would be the base pointer to a sub-table. The fine index selects the entry in this sub-table. In many cases this sub-table is small and typically includes less than 16 bytes of data.

SUMMARY OF THE INVENTION

A data processing apparatus execution unit includes a multiplexer having inputs receiving data from sections of a source data register or registers. The multiplexer selects data from one section to store in a destination data register. The indication of the selected section may be in an instruction immediate constant field or in a second source data register. The source data registers may be two consecutively numbered data registers. The execution unit may zero extend or sign extend the remaining most significant bits of the destination data.

In an alternative embodiment, the execution unit includes plural multiplexers, one for each section of the destination data. Each multiplexer received data from each section of the source data register or registers. The instruction specifies the data selection of each multiplexer. Special codes in the sections of the second source data register may select 0 fill, 1 fill or sign extension from the next most significant section for each multiplexer.

This instruction can be useful in algorithms that repeatedly access short look up tables. In many cases such look up tables are two dimensional with one dimension requiring more calculation than the other. Thus an initial estimate of the value to be loaded can be known before the exact loop up table element is known. The values to be accessed are often smaller than the data processor word size. For example, many data processors use 32-bit data words while the values to be accessed may be a byte (8 bits). In this case, it is advantageous in terms of memory use and data transfer traffic to pack plural elements into corresponding sections of data processor words. It is often possible to arrange the look up table so that the initial index estimate limits the final look up table element to within a word or a doubleword in memory. It is advantageous to prefetch this word or doubleword while the calculation of the full look up table index completes. Immediately following the complete index calculation, the indicated section of the already loaded data is moved to another register using the register move instruction of this invention. The prefetch of the word or doubleword hides the memory access latency behind the fine look up table index calculation. This reduces or eliminates the time lost in delay slots following the memory load. This can speed the rate of the algorithm by shortening loop time. This may also permit more loops to be performed simultaneously using loop unrolling.

BRIEF DESCRIPTION OF THE DRAWINGS

These and other aspects of this invention are illustrated in the drawings, in which:

FIG. 7 is a schematic view of the halfword select move from a word source instruction of this invention;

FIG. 8 is a schematic view of the halfword select move from a doubleword source instruction of this invention;

FIG. 11 is a schematic view of the halfword select move from a word source with sign extension instruction of this invention;

FIG. 12 is a schematic view of the halfword select move from a doubleword source with sign extension instruction of this invention;

FIG. 18 illustrates an example of a regular look up table;

FIG. 19 illustrates an example of an irregular look up table;

FIG. 22 illustrates the operation of an extract and zero extend instruction useful in the method of this invention (prior art).

DETAILED DESCRIPTION OF PREFERRED EMBODIMENTS

A preferred embodiment of this invention will be described in this section. This invention is not limited to the preferred embodiment. It would be a straight forward task for one skilled in the art to apply the invention to a larger class of data processing architectures that employ statically scheduled execution with predication mechanism. This description corresponds to the Texas Instruments TMS320C6400 digital signal processor.

Figure 1:
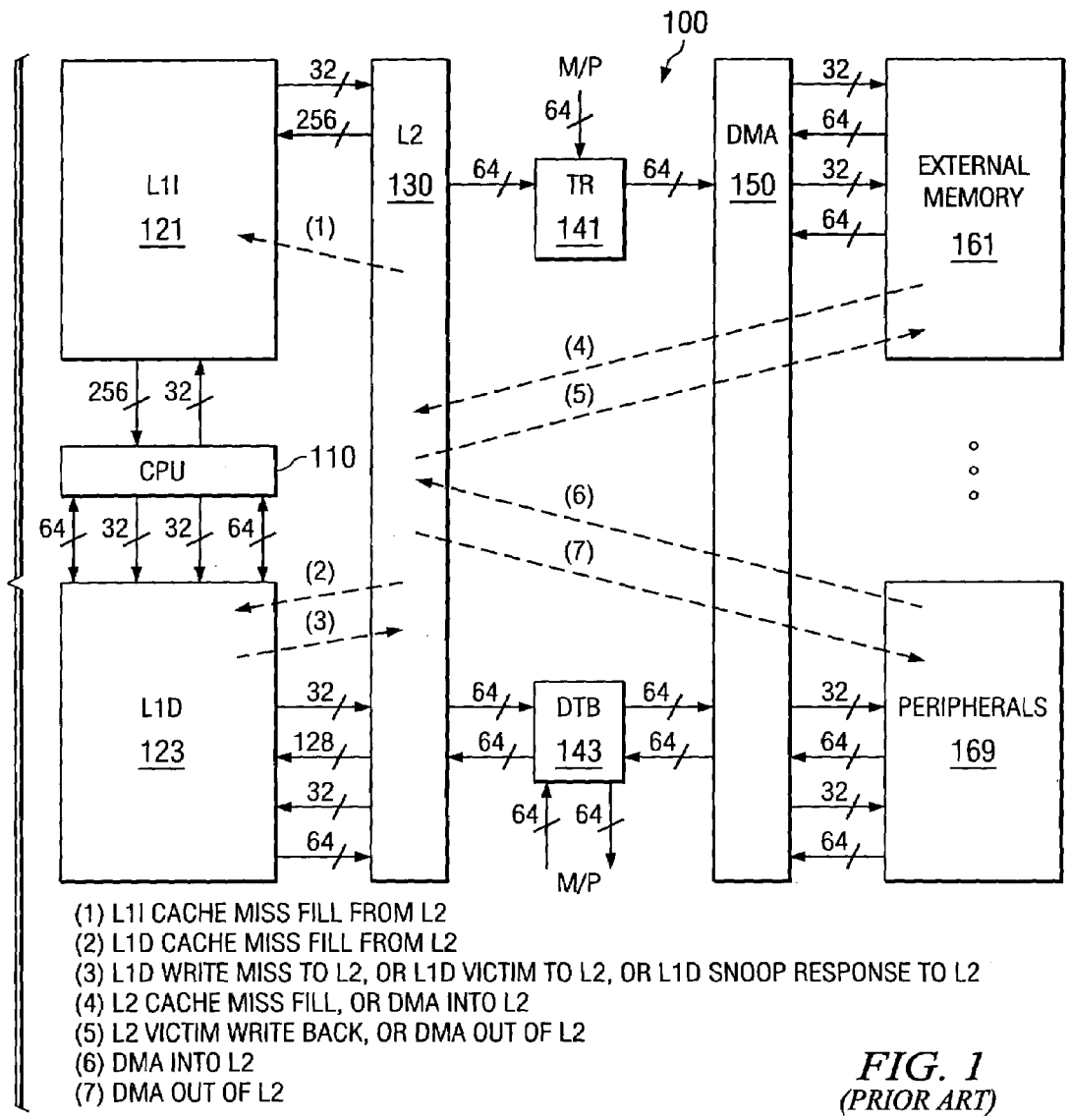
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

Figure 2:
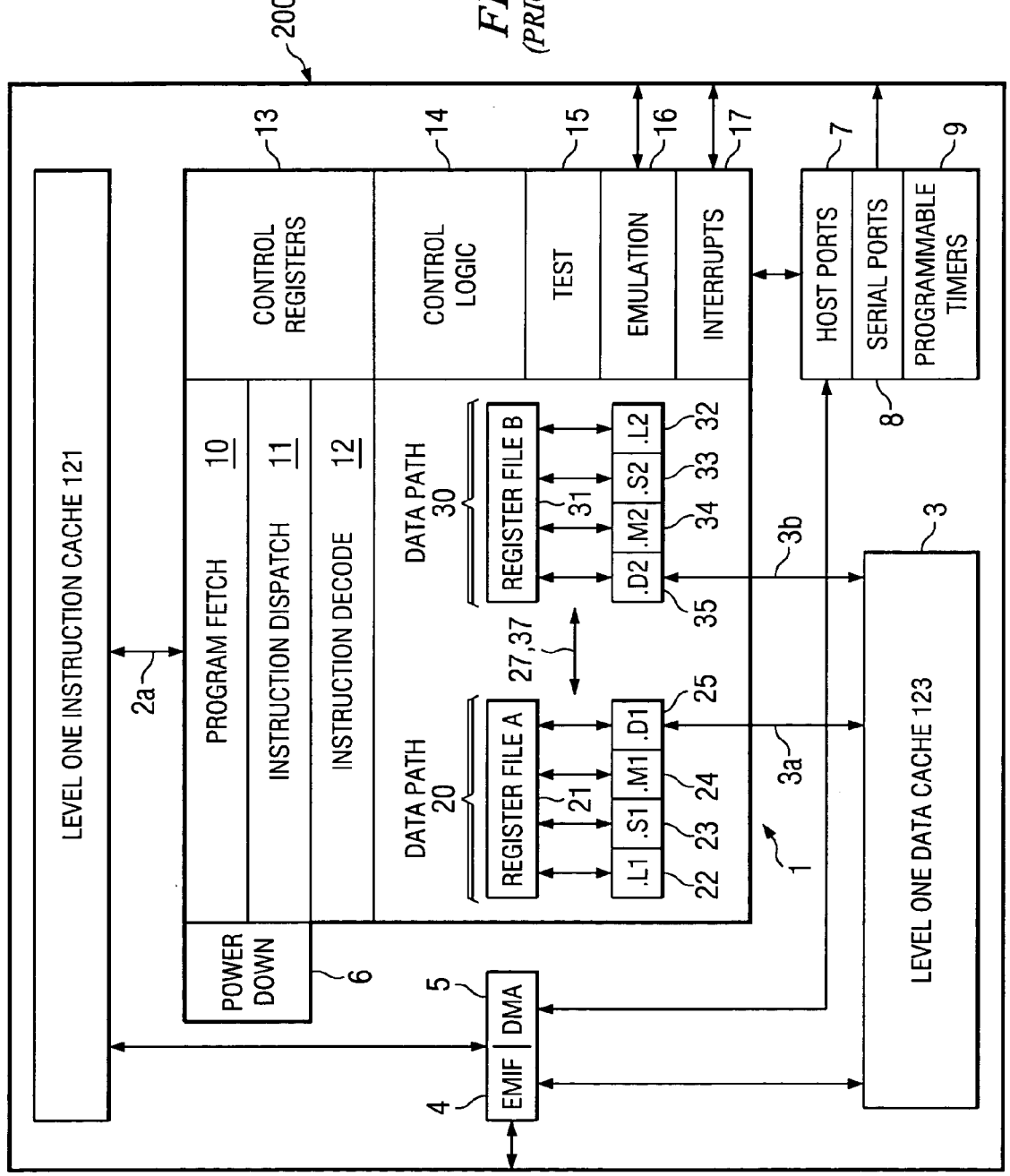
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level 1 instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs in each of the two data paths 20 and 30. As previously described above each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
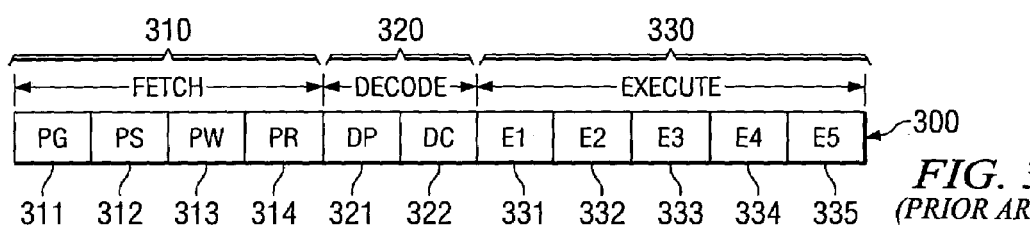
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E2) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16×16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extensions instructions, the results are written to a register file. Multiply extension instructions complete during the E4 phase 334.

During E5 phase 335, load instructions write data into a register. Load instructions complete during the E5 phase 335.

Figure 4:
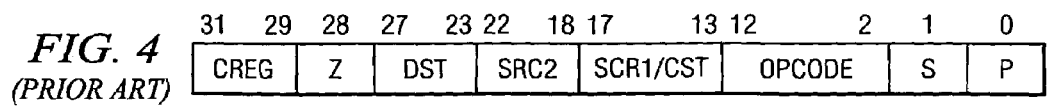
FIG. 4 illustrates the instruction syntax of the very long instruction word digital signal processor core illustrated in FIG. 2 (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional Register | creg | | | z |
|---|---|---|---|---|
| | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Figure 5:
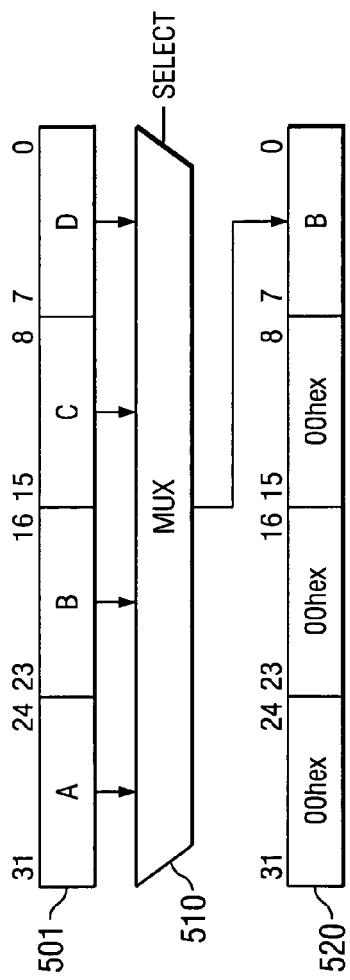
FIG. 5 is a schematic view of the byte select move from a word source instruction of this invention.

FIG. 5 illustrates the operation of the byte select register move instruction of this invention. In the preferred embodiment of this invention the byte select register move instruction may be executed by L units 22 and 32 and D units 25 and 35 in a manner similar to a register move instruction implemented in the TMS320C6400 digital signal processor. This byte select register move instruction may be conditional based upon a selected predicate registers as described above regarding the creg field and the z bit. The dst field specifies the register location where the resultant data is stored within the corresponding register file 20 or 30. The scr2 field specifies the source register location within the corresponding register file 20 or 30 providing the input data. The scr1/cst field specifies the byte extracted. This instruction preferably has an immediate constant form and a register form. In the immediate constant form the scr1/cst field is an immediate constant of 5 bits. The two least significant bits of the scr1/cst field control the byte selection. The other bits are ignored. In the register form the scr1/cst field specifies one of the data registers within the corresponding data register file 20 or 30. The two least significant bits (bits 1 and 0) of this register control the byte selection. The other bits in this register are ignored. In the preferred embodiment the extracted byte is specified as shown in Table 2 below.

TABLE 2

| cst data | scr1 bits 1:0 | Byte | Bits |
|---|---|---|---|
| x xx00 | 00 | A | 31-24 |
| x xx01 | 01 | B | 23-16 |
| x xx10 | 10 | C | 15-8 |
| x xx11 | 11 | D | 7-0 |

Only the two least significant bits of the constant field or of the register data are used to specify the selected byte.

The execution unit includes multiplexer 510 to make the byte selection. Input data 501 from the register specified by the scr2 field is divided into fields A (bits 24 to 31), B (bits 16 to 23), C (bits 8 to 15) and D (bits 0 to 7). Each of these bit fields are supplied to a corresponding one of the four inputs of multiplexer 510. Multiplexer 510 receives a select signal indicating the byte specified by the scr1/cst field and supplies this byte to the least significant bits (0 to 7) of output 520. Each of the other bytes of output 520 (bits 8 to 15, bits 16 to 23 and bits 24 to 31) are filled with eight zeros ("00000000" or "00" hexadecimal). The data of output 520 is stored in the destination register specified by the dst field. The result is that the selected byte is placed in the least significant bits of the destination register. In the example illustrated in FIG. 5, the scr1/cst field is "x xx01" which specifies the B byte (bits 16 to 23).

Figure 6:
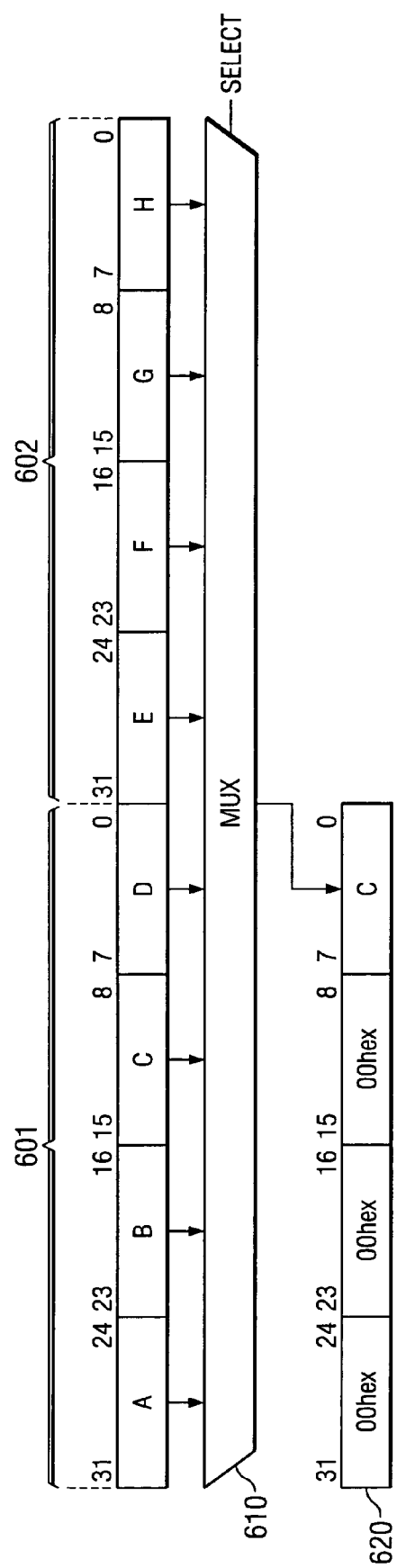
FIG. 6 is a schematic view of the byte select move from a doubleword source instruction of this invention.
Figure 9:
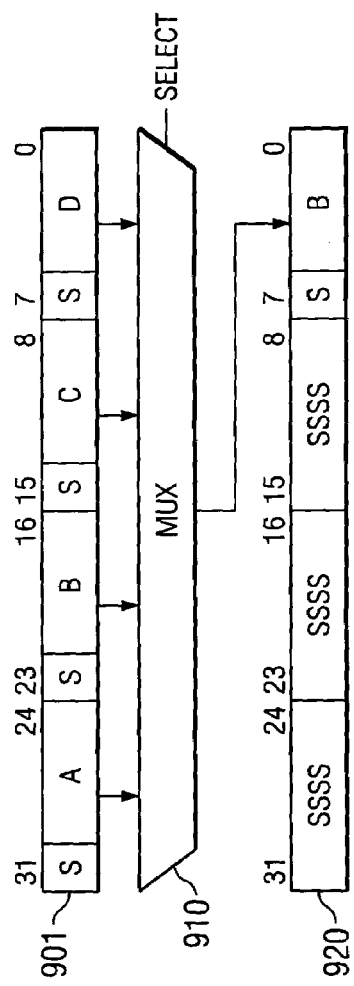
FIG. 9 is a schematic view of the byte select move from a word source with sign extension instruction of this invention.
Figure 10:
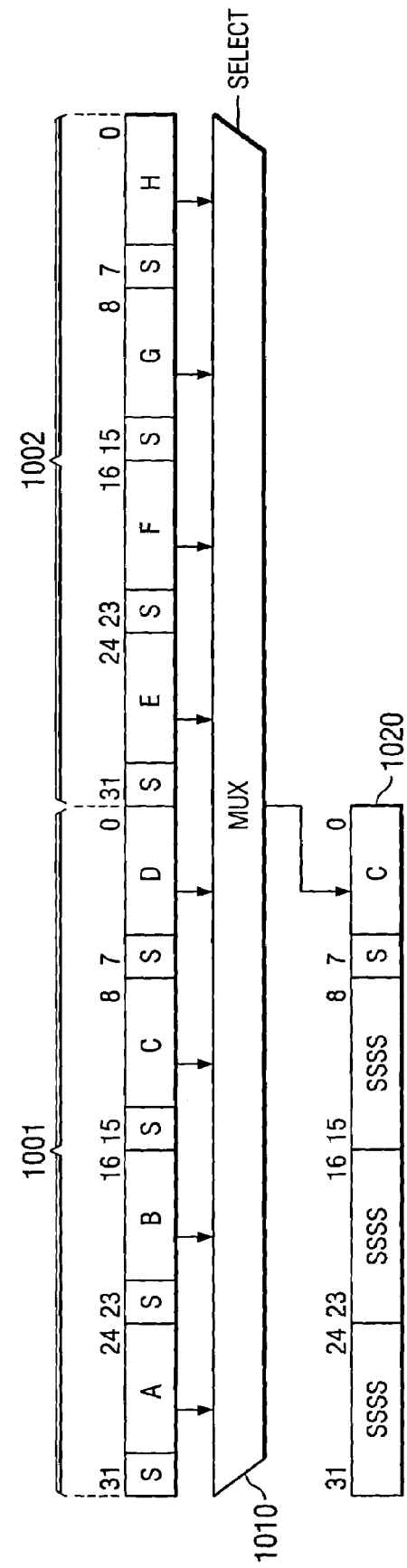
FIG. 10 is a schematic view of the byte select move from a doubleword source with sign extension instruction of this invention.

FIG. 6 illustrates the operation of the byte select register move instruction of this invention with a doubleword source. The dst field specifies the register location of where the resultant data is stored within the corresponding register file 20 or 30. The scr2 field specifies the source register location of an even/odd pair of registers within the corresponding register file 20 or 30 providing the input data. The source register field must specify the even numbered register and the next odd register is an implied operand. The scr1/cst field specifies the byte extracted. In the preferred embodiment the extracted byte is specified as shown in Table 3 below.

TABLE 3

| cst data | scr1 bits 2:0 | Byte | Bits |
|---|---|---|---|
| x x000 | 000 | A | 31-24 word 601 |
| x x001 | 001 | B | 23-16 word 601 |
| x x010 | 010 | C | 15-8 word 601 |
| x x011 | 011 | D | 7-0 word 601 |
| x x100 | 100 | E | 31-24 word 602 |
| x x101 | 101 | F | 23-16 word 602 |
| x x110 | 110 | G | 15-8 word 602 |
| x x111 | 111 | H | 7-0 word 602 |

Only the three least significant bits of the immediate constant or the register data are used to specify the selected byte.

Input data 601 from the even register specified by the scr2 field is divided into fields A, B, C and D. Input data 602 from the odd register specified by the scr2 field is divided into fields E, F, G and H. Each of these bit fields are supplied to a corresponding one of the eight inputs of multiplexer 610. Multiplexer 610 receives a select signal indicating the byte specified by the scr1/cst field and supplies this byte to the least significant bits (0 to 7) of output 620. Each of the other bytes of output 620 is zero filled. The data of output 620 is stored in the destination register specified by the dst field. In the example illustrated in FIG. 6, the scr1/cst field is "x x010" which specifies the C byte (bits 0 to 7 of data word 601).

FIG. 7 illustrates the operation of the halfword select register move instruction of this invention with a word source. The dst field specifies the register location of where the resultant data is stored within the corresponding register file 20 or 30. The scr2 field specifies the source register location within the corresponding register file 20 or 30 providing the input data. The scr1/cst field specifies the byte extracted. In the preferred embodiment the extracted byte is specified as shown in Table 4 below.

TABLE 4

| cst data | scr1 bit 0 | Halfword | Bits |
|---|---|---|---|
| x xxx0 | 0 | A | 31-16 |
| x xxx1 | 1 | B | 0-15 |

Only the least significant bit of the immediate constant or the register data is used to specify the selected byte.

Input data 701 from the register specified by the scr2 field is divided into fields A and B. These two bit fields are supplied to a corresponding one of the two inputs of multiplexer 710. Multiplexer 710 receives a select signal indicating the halfword specified by the scr1/cst field and supplies this halfword to the least significant bits (0 to 15) of output 720. The other halfword of output 720 is filled with "0000000000000000" or "0000" hexadecimal. The data of output 720 is stored in the destination register specified by the dst field. In the example illustrated in FIG. 7, the scr1/cst field is "x xxx0" which specifies the A halfword (bits 16 to 31).

FIG. 8 illustrates the operation of the halfword select register move instruction of this invention with a double-word source. The dst field specifies the register location where the resultant data is stored within the corresponding register file 20 or 30. The scr2 field specifies the source register location of an even/odd pair of registers within the corresponding register file 20 or 30 providing the input data. The source register field must specify the even numbered register and the next odd register is an implied operand. The scr1/cst field specifies the byte extracted. In the preferred embodiment the extracted byte is specified as shown in Table 5 below.

TABLE 5

| cst data | scr1 bits 1:0 | Halfword | Bits |
|---|---|---|---|
| x xx00 | 00 | A | 31-16 word 801 |
| x xx01 | 01 | B | 15-0 word 801 |
| x xx10 | 10 | C | 31-16 word 802 |
| x xx11 | 11 | D | 15-0 word 802 |

Only the two least significant bits of the immediate constant or the register data are used to specify the selected byte.

Input data 801 from the even register specified by the scr2 field is divided into fields A and B. Input data 802 from the odd register specified by the scr2 field is divided into fields C and D. Each of these bit fields are supplied to a corresponding one of the four inputs of multiplexer 810. Multiplexer 810 receives a select signal indicating the halfword specified by the scr1/cst field and supplies this halfword to the least significant bits (0 to 15) of output 820. The other halfword of output 820 is zero filled. The data of output 820 is stored in the destination register specified by the dst field. In the example illustrated in FIG. 8, the scr1/cst field is "x xx11" which specifies the D halfword (bits 0 to 15 of data word 802).

FIGS. 9 to 12 are similar to FIGS. 4 to 8 except that the most significant bits are sign filled rather than zero filled. In the input data words 901, 1001, 1101 and 1201 each section is a signed integer. Each section includes a sign bit indicative of the sign of that number. A 0 sign bit indicates a positive sign. A 1 sign bit indicates a negative sign. Upon selection of a section to place in the least significant bits of the destination register, the most significant bits are filled with the sign bit (the most significant bit) of the selected section. These instructions otherwise operate as previously described in conjunction with FIGS. 4 to 8.

Figure 13:
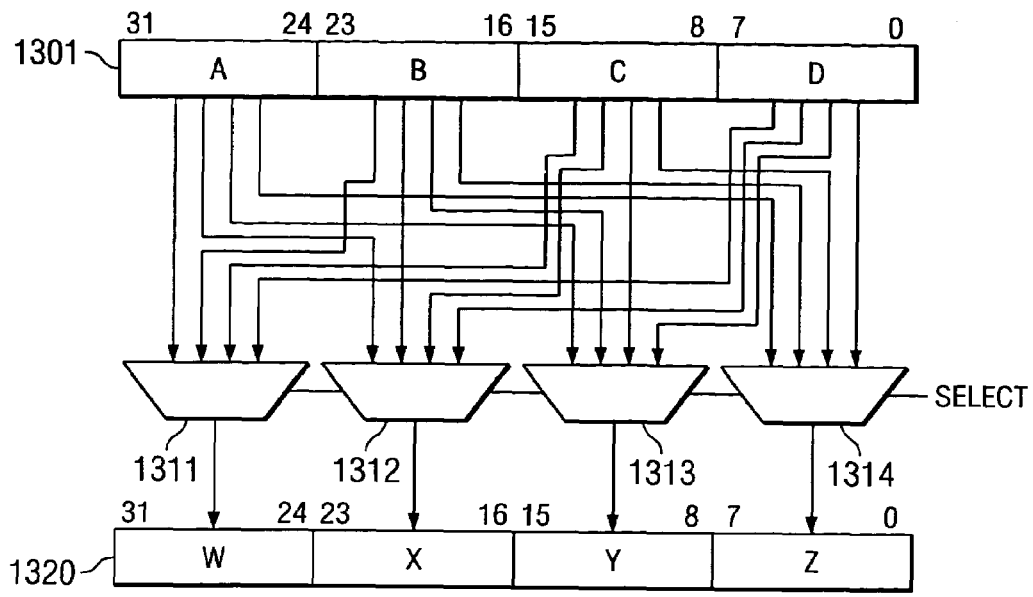
FIG. 13 is a schematic view of the multiple byte select from a word register move instruction of this invention.

FIGS. 13 to 16 illustrate a further embodiment of this select instruction. FIG. 13 illustrates a multiple byte select from a word register move instruction. Input data 1301 from the register specified by the scr2 field is divided into byte sections. Data from each byte section A (bits 24 to 31), B (bits 16 to 23), C (bits 8 to 15) and D (bits 0 to 7) is supplied to a corresponding input of each multiplexer 1311, 1312, 1313 and 1314. The multiplexers 1311, 1312, 1313 and 1314 select the bits of one input for supply to a corresponding section of output data 1320. Multiplexer 1311 supplies data to section W (bits 24 to 31). Multiplexer 1312 supplies data to section X (bits 16 to 23). Multiplexer 1313 supplies data to section Y (bits 8 to 15). Multiplexer 1314 supplies data to section Z (bits 0 to 7). The selection made by each multiplexer 1311, 1312, 1313 and 1314 are controlled by data in the register specified by the scr1/cst field. The data in the corresponding section of this register controls the selection of the multiplexer. Thus data in bits 25 to 31 controls the selection of multiplexer 1311, data in bits 16 to 23 controls the selection of multiplexer 1312, data in bits 8 to 15 controls the selection of multiplexer 1313 and data in bits 0 to 7 control the selection of multiplexer 1314. This selection preferably takes place as shown in Table 6.

TABLE 6

| scr1 section bits | Byte | Bits |
|---|---|---|
| xxxx x000 | A | 31-24 |
| xxxx x001 | B | 23-16 |
| xxxx x010 | C | 15-8 |
| xxxx x011 | D | 7-0 |
| 1111 11xx | — | 0000 0000 |
| 0000 11xx | — | 1111 1111 |
| 1100 11xx | — | sign extend |

Table 6 shows the coding of the least significant bits of each section controlling selection of the corresponding multiplexer. This coding permits arbitrary rearrangement of data from input data 1301 into output data 1320 including duplication of some data and omission of other data. Several special coded shown in Table 6 cause the corresponding multiplexer to zero fill, one fill or sign extend the corresponding section of output data 1320. This sign extension is based on the most significant bit of the next less significant section of input data 1301. In the example of Table 6 the special codes are distinguished from the section selection codes by a 1 at bit 2 rather than a 0. This coding is not required. All that is required is to unambiguously distinguish the various multiplexer actions.

Figure 14:
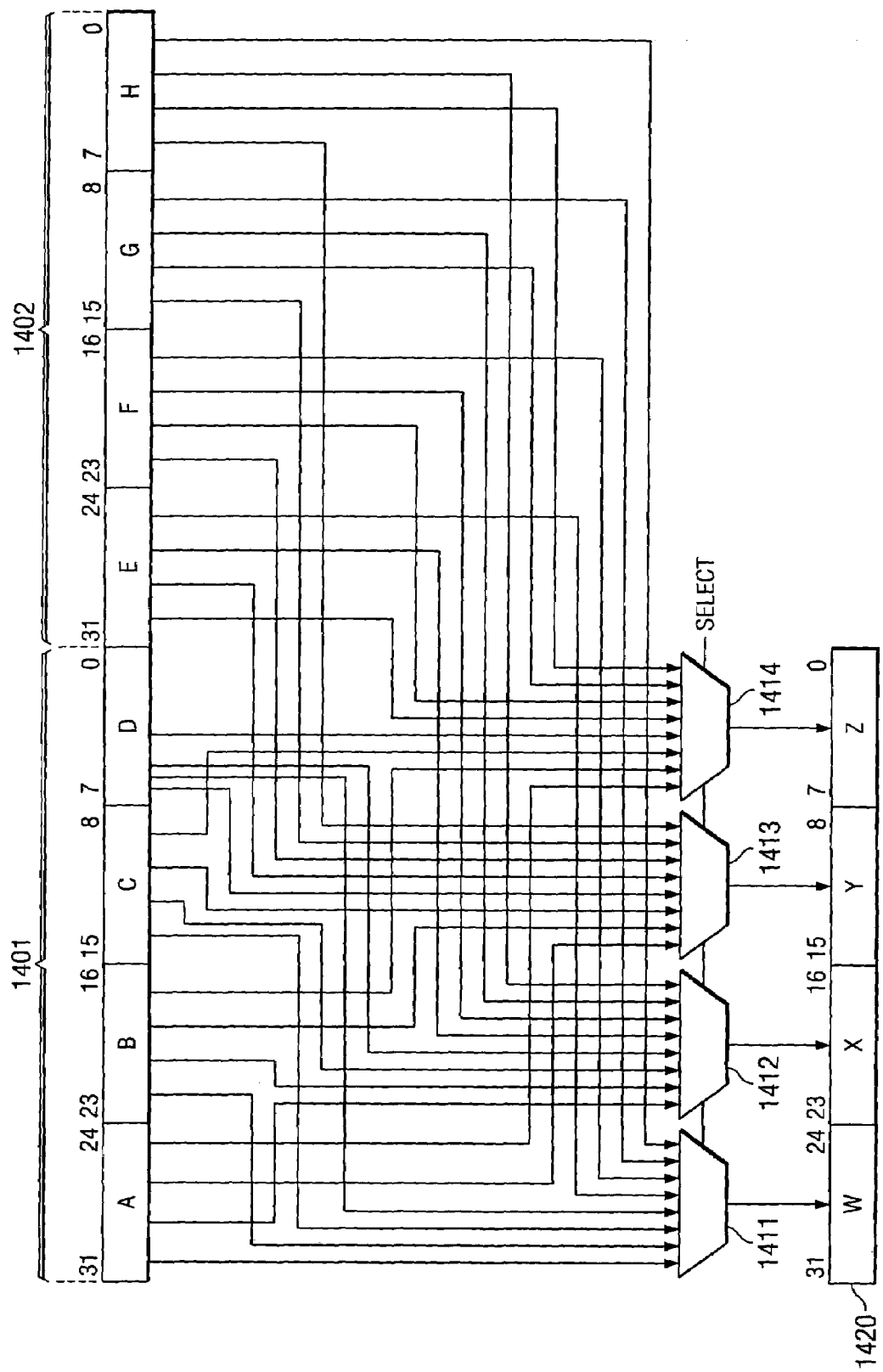
FIG. 14 is a schematic view of the multiple byte select move from a doubleword source instruction of this invention.

FIG. 14 illustrates a multiples byte select from a double-word register move instruction. Input data 1401 and 1402 from the even/odd register pair specified by the scr2 field are divided into byte sections. Data from each byte section A (bits 24 to 31 of input data 1401), B (bits 16 to 23 of input data 1401), C (bits 8 to 15 of input data 1401), D (bits 0 to 7 of input data 1401), E (bits 24 to 31 of input data 1402), F (bits 16 to 23 of input data 1402), G (bits 8 to 15 of input data 1402) and H (bits 0 to 7 of input data 1402) is supplied to a corresponding input of each multiplexer 1411, 1412, 1413 and 1414. The multiplexers 1411, 1412, 1413 and 1414 select the bits of one input for supply to a corresponding section of output data 1420. Multiplexer 1411 supplies data to section W (bits 24 to 31). Multiplexer 1412 supplies data to section X (bits 16 to 23). Multiplexer 1413 supplies data to section Y (bits 8 to 15). Multiplexer 1414 supplies data to section Z (bits 0 to 7). The selection made by each multiplexer 1411, 1412, 1413 and 1414 are controlled by data in the register specified by the scr1/cst field. The data in the corresponding section of this register controls the selection of the multiplexer. Thus data in bits 25 to 31 controls the selection of multiplexer 1411, data in bits 16 to 23 controls the selection of multiplexer 1412, data in bits 8 to 15 controls the selection of multiplexer 1413 and data in bits 0 to 7 control the selection of multiplexer 1414. This selection preferably takes place as shown in Table 7.

TABLE 7

| scr1 section bits | Byte | Bits |
|---|---|---|
| xxxx 0000 | A | 31-24 word 1401 |
| xxxx 0001 | B | 23-16 word 1401 |
| xxxx 0010 | C | 15-8 word 1401 |
| xxxx 0011 | D | 7-0 word 1401 |
| xxxx 0100 | E | 31-24 word 1402 |
| xxxx 0101 | F | 23-16 word 1402 |
| xxxx 0110 | G | 15-8 word 1402 |
| xxxx 0111 | H | 7-0 word 1402 |
| 1111 1xxx | — | 0000 0000 |
| 0000 1xxx | — | 1111 1111 |
| 1100 1xxx | — | sign extend |

The special codes of the example of Table 7 (zero fill, one fill and sign extend) are distinguished from the section selection codes by a 1 at bit 3 rather than a 0.

Figure 15:
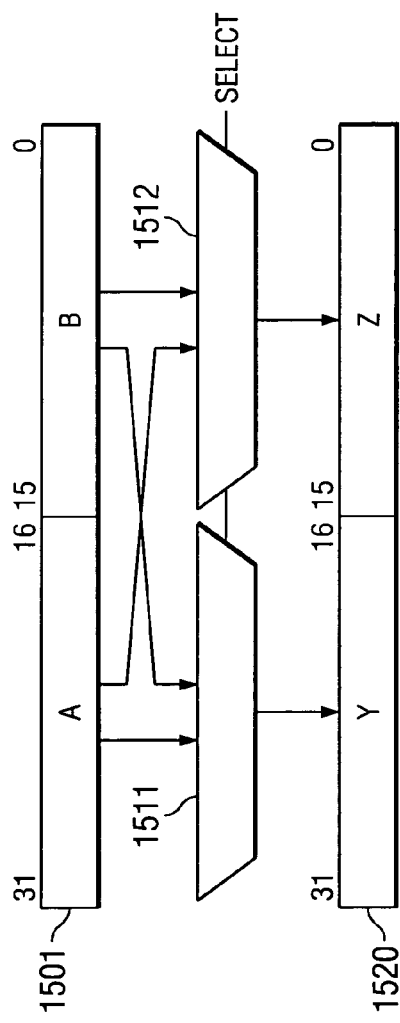
FIG. 15 is a schematic view of the multiple halfword select move from a word source instruction of this invention.

FIG. 15 illustrates the operation of a multiple halfword selection from a word register move instruction. Input data 1501 from the register specified by the scr2 field is divided into halfword sections. Data from each halfword section A (bits 16 to 31) and B (bits 0 to 15) is supplied to a corresponding input of each multiplexer 1511 and 1512. The multiplexers 1511 and 1512 select the bits of one input for supply to a corresponding section of output data 1520. Multiplexer 1511 supplies data to section Y (bits 16 to 31). Multiplexer 1512 supplies data to section Z (bits 0 to 15). The selection made by each multiplexer 1511 and 1512 are controlled by data in the register specified by the scr1/cst field. The data in the corresponding section of this register controls the selection of the multiplexer. Thus data in bits 16 to 31 controls the selection of multiplexer 1511 and data in bits 0 to 15 controls the selection of multiplexer 1512. In the preferred embodiment the extracted byte is specified as shown in Table 8 below.

TABLE 8

| scr1 section bits | Halfword | Bits |
|---|---|---|
| xxxx xx00 | A | 31-16 |
| xxxx xx01 | B | 0-15 |
| 1111 111x | — | 0000 0000 |
| 0000 111x | — | 1111 1111 |
| 1100 111x | — | sign extend |

The special codes of the example of Table 8 (zero fill, one fill and sign extend) are distinguished from the section selection codes by a 1 at bit 1 rather than a 0.

Figure 16:
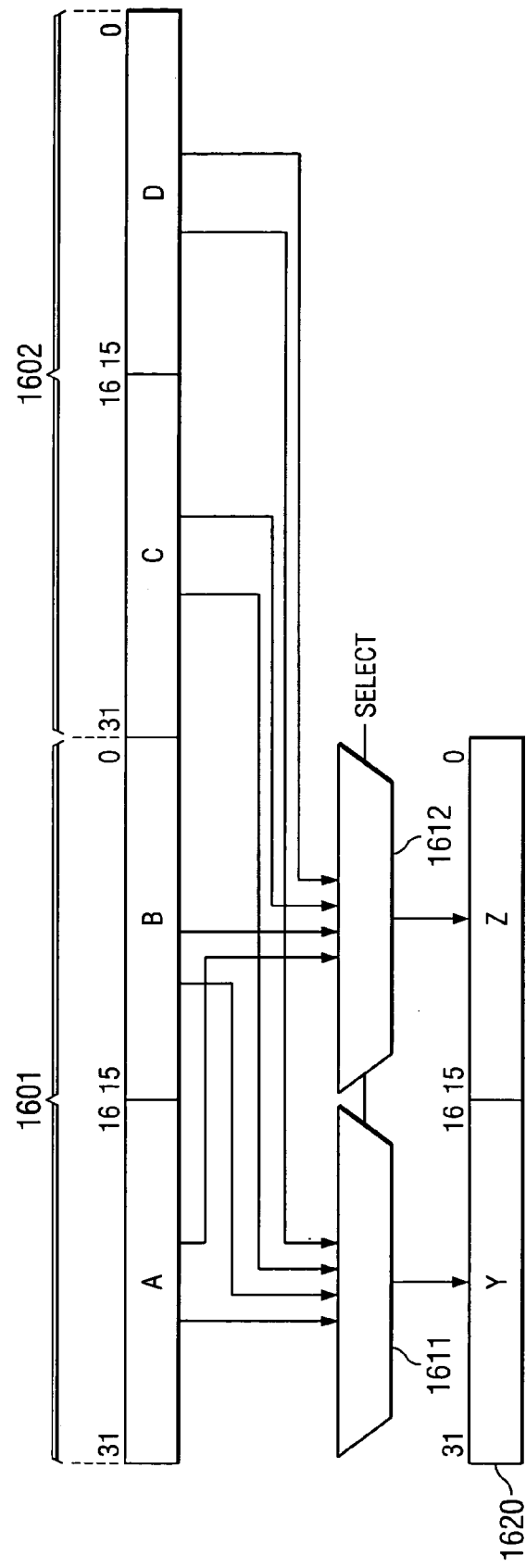
FIG. 16 is a schematic view of the multiple halfword select move from a doubleword source instruction of this invention.

FIG. 16 illustrates the operation of the halfword select register move from doubleword instruction. Input data 1601 and 1602 from the even/odd register pair specified by the scr2 field are divided into byte sections. Data from each halfword section A (bits 16 to 31 of input data 1601), B (bits 0 to 15 of input data 1601), C (bits 16 to 31 of input data 1602) and D (bits 0 to 15 of input data 1602) is supplied to a corresponding input of each multiplexer 1611 and 1612. The multiplexers 1611 and 1610 select the bits of one input for supply to a corresponding section of output data 1620. Multiplexer 1611 supplies data to section Y (bits 0 to 15). Multiplexer 1612 supplies data to section Z (bits 0 to 15). The selection made by each multiplexer 1611 and 1612 are controlled by data in the register specified by the scr1/cst field. The data in the corresponding section of this register controls the selection of the multiplexer. Thus data in bits 16 to 31 controls the selection of multiplexer 1611 and data in bits 0 to 15 controls the selection of multiplexer 1612. This selection preferably takes place as shown in Table 9.

TABLE 9

| scr1 section bits | Byte | Bits |
|---|---|---|
| xxxx x000 | A | 31-16 word 1601 |
| xxxx x001 | B | 15-0 word 1601 |
| xxxx x010 | C | 31-16 word 1602 |
| xxxx x011 | D | 15-0 word 1602 |
| 1111 11xx | — | 0000 0000 |
| 0000 11xx | — | 1111 1111 |
| 1100 11xx | — | sign extend |

The special codes of the example of Table 9 (zero fill, one fill and sign extend) are distinguished from the section selection codes by a 1 at bit 2 rather than a 0.

Decoding entropy coded data represents a difficult computing problem. Various video and audio media are entropy coded. In entropy coding each of the symbols to be encoded are assigned coded words. These coded words are arranged so that most frequently occurring symbols are represented by fewer bits than less frequently occurring symbols. This process enables data compression because fewer bits are required for the most used symbols. This also presents a decoding problem. Entropy coding employs a varying number of bits per symbol. The data stream is typically transmitted or stored without marking the beginning of the symbol codes. In practice the previous symbol is decoded and its length known before the start of the next symbol can be determined. This makes entropy decoding an inherently serial process. Typical parallel processing techniques are not effective to increase decoding speed.

Entropy decoding typically employs a look up table. The first few bits of each encoded data word typically provide some indication of the data length. The following bits of each particular data length word indicate the encoded symbol. Decoding usually takes place by determining an index into a look up table and reading the indexed entry, which corresponds to the encoded symbol. Thus entropy decoding typically requires repeated access to a look up table. Such look up tables are typically small enough to store in the data processor cache (such as level one data cache 123) but too large to store in the register file (such as register files 20 and 30). Access to the look up table thus requires repeatedly loading data from a memory address, which may be stored in cache, into a register file. This operation is generally called a register load operation. In the typical case, these look up table accesses follow no predictable pattern but wander through the whole range of the look up table. For the example TMS320C6400 digital processor employing the instruction pipeline illustrated in FIG. 3, there are at least four delay slots following dispatch of a register load instruction before receipt and storage of the requested data assuming the data is available in level one data cache 123. There are more delay slots if the data must be fetched from level two unified cache 130 or external memory 161. Despite the eight execution units (L units 22 and 23, S units 23 and 33, M units 24 and 34, and D units 25 and 35), no other useful computation can take place because all further processing is dependent on the data being fetched. The example VLIW processor of FIG. 1 could potentially perform 32 instructions during these four delay slots. This represents a bottleneck in the decoding of entropy coded data. It is not generally possible to employ other parallel data processing techniques in these cases due to the serial nature of the decoding process.

The method of this invention employs a two step index calculation and a speculative load to speed this look up table process. In many instances the calculation of the look up table index can be divided into two parts. These two parts are called a coarse index and a fine index. The coarse index can be more quickly calculated than the fine index. However, knowledge of the coarse index limits the locations indexed within the look up table to within the range of the fine index. This invention speculatively loads all data in the look up table within the range of data selected by the coarse index. The fine index is calculated during the delay slots while the speculative load or loads occur. Upon calculation of the fine index, the indexed data is extracted from the speculatively fetched data. This process serves to hide some or all of the load latency behind the calculation of the fine index. Thus the look up table entry data is available sooner than would otherwise happen. This speeds the entire decode process.

Figure 17:
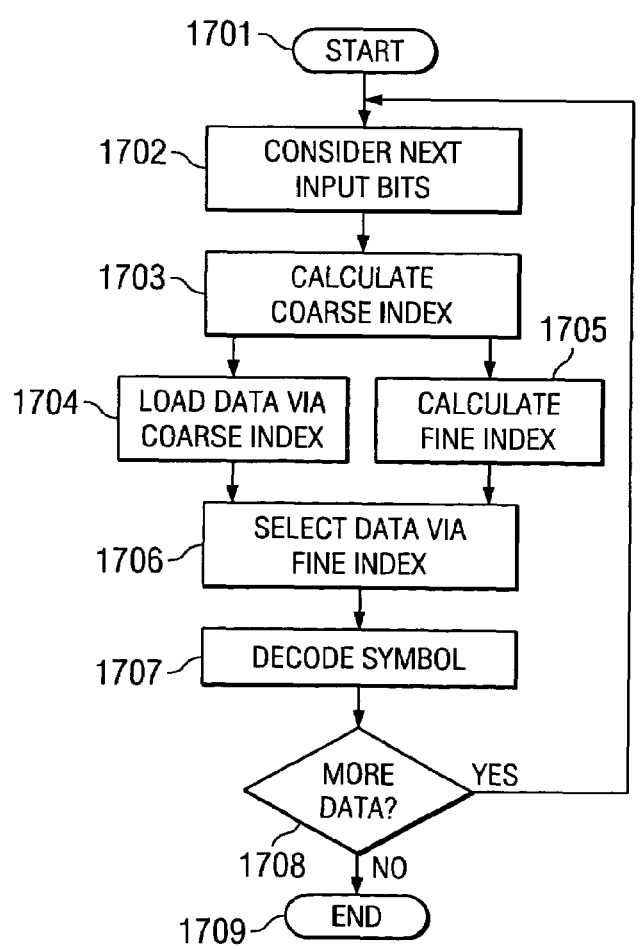
FIG. 17 is a flow chart of the method of speculative loading look up table data based upon a coarse index while calculating a fine index.

FIG. 17 illustrates this process in flow chart form. This process begins with start block 1701. The process considers the next input bits (processing block 1702). Then the process calculates the coarse index (processing block 1703). The next processes occur in parallel. The process loads the data indicated by the coarse index (processing block 1704) and waits for its arrival while calculating the fine index (processing block 1705).

There are several alternatives in the load block (processing block 1704) depending on the nature of the look up table and the instruction set of the data processor. The simplest case is a rectangular look up table as illustrated in FIG. 18. FIG. 18 illustrates an example of a look up table with ten lines of eight entries each. There are eight A entries A0 to A7. Address 1801 points to the first entry A0 in this line. There are eight B entries B0 to B7. Address 1802 points to the first entry B0 in this line. There are eight C entries C0 to C7. Address 1803 points to the first entry C0 in this line. There are eight D entries D0 to D7. Address 1804 points to the first entry D0 in this line. There are eight E entries E0 to E7. Address 1805 points to the first entry E0 in this line. There are eight F entries F0 to F7. Address 1806 points to the first entry F0 in this line. There are eight G entries G0 to G7. Address 1807 points to the first entry G0 in this line. There are eight H entries H0 to H7. Address 1808 points to the first entry H0 in this line. There are eight I entries I0 to I7. Address 1809 points to the first entry I0 in this line. There are eight J entries J0 to J7. Address 1810 points to the first entry J0 in this line. In this example the coarse index selects one of the lines by pointing to one of the addresses 1801 to 1810. In this example, each look up table entry A0 to J7 is one byte (8 bits) that are packed into two sets of data words 1821 and 1822 per line. Thus each coarse index points to 8 look up table entries packed in two consecutive memory data words. For each coarse index, processing block 1704 loads the corresponding 8 look up table entries.

The TMS320C6400 instruction set includes several load instructions that may be used for this load. The most straight forward is a load doubleword instruction. The load doubleword instruction fetches the two 32-bit data words located at doubleword boundaries in memory into a register pair. The dst field of the instruction specifies the even data register and the corresponding next higher number odd data register is an implied operand. The 64 bits fetched from memory are stored in the designated pair of data registers. This is most useful for a regular look up table as illustrated in FIG. 18 with the lines starting at doubleword boundaries.

The TMS320C6400 also includes a non-aligned doubleword load instruction. It is typical for a data processor address to point to an individual byte (8 bits) regardless of the actual data width of the data processor and the accompanying memory. The non-aligned doubleword load instruction can fetch any consecutive 64 bits from memory on byte boundaries. This load instruction would be most useful in a sparsely populated look up table such as illustrated in FIG. 19. FIG. 19 illustrates the logical organization of an example sparsely populated look up table. There are eight A entries A0 to A7. Address 1901 points to the first entry A0 in this line. There are five B entries B0 to B4. Address 1902 points to the first entry B0 in this line. There are seven C entries C0 to C6. Address 1903 points to the first entry C0 in this line. There are five D entries D0 to D4. Address 1904 points to the first entry D0 in this line. There are eight E entries E0 to E7. Address 1905 points to the first entry E0 in this line. There are two F entries F0 and F1. Address 1906 points to the first entry F0 in this line. There are four G entries G0 to G3. Address 1907 points to the first entry G0 in this line. There are seven H entries H0 to H6. Address 1908 points to the first entry H0 in this line. There are eight I entries I0 to I7. Address 1909 points to the first entry I0 in this line. There are four J entries J0 to J3. Address 1910 points to the first entry J0 in this line. In this example the coarse index selects one of the lines by pointing to one of the addresses 1901 to 1910. Such a sparsely populated look up table generally corresponds to a non-symmetrical tree decoder.

Figure 20:
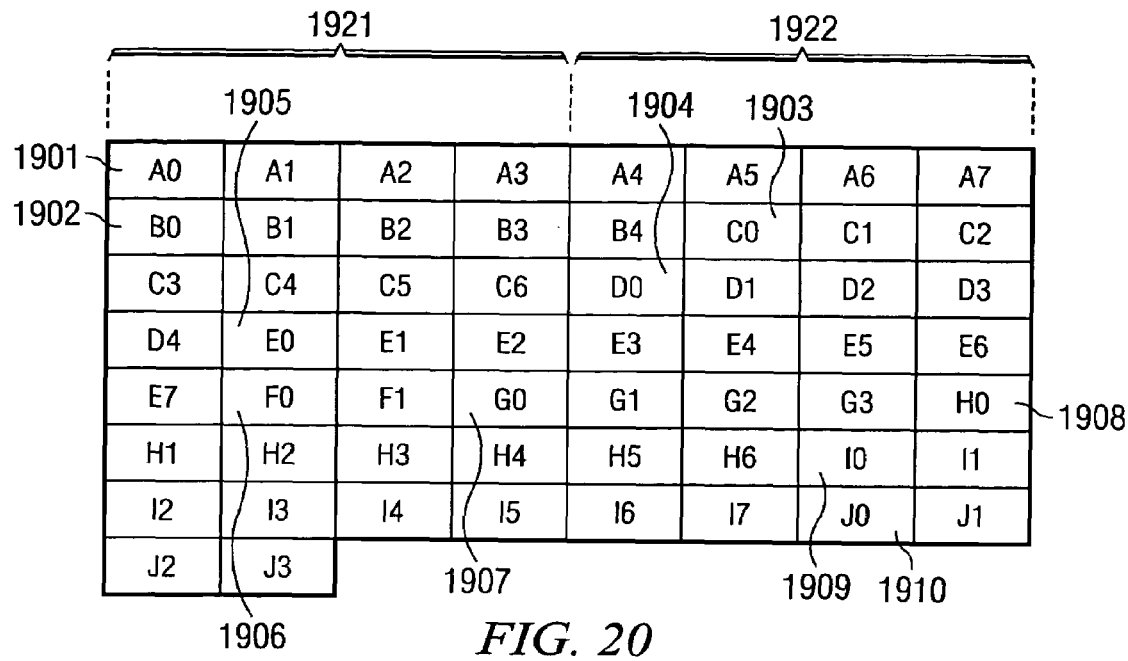
FIG. 20 illustrates an example of the irregular look up table of FIG. 11 with the data packed into memory.

In order to save memory, this table structure may be stored as illustrated in FIG. 20. Addresses 1901 to 1910 point to the start of each set of entries. In this example, the look up table entries are packed into two sets of data words 1921 and 1922. Because some of the sets of entries include 8 entries, each speculative fetch must include 8 entries or 64 bits. The non-aligned doubleword load instruction can load any 64 consecutive bits on a byte boundary into a specified register pair. For those sets of entries having less than 8 entries, the fine index will not point to data outside the allowable range. Thus more data is loaded than necessary but the speculative load always loads all data that might be specified by the previously calculated coarse index and the fine index. For example, if the coarse index specifies address 1906, the non-aligned doubleword load instruction would load look up table entries F0, F1, G0, G1 in the first data register and look up table entries G2, G3, H0 and H1 in the second data register. The fine index could only specify entries F0 and F1, the other loaded data would be ignored.

The speculative look up table entry load does not require any special load operations. It is possible to perform this speculative load with one or two 32-bit data load instructions. If the coarse index specifies a maximum of 32 bits or less of data, a single word load would be sufficient. Even if the data specified by a coarse index is more than 32 bits, ordinary 32-bit register loads may be used. Note that digital signal processor integrated circuit 200 includes two D units 25 and 35, each of which may load a 32-bit data word into a corresponding register in the same cycle. Further, the method may use a single D unit and consecutive 32-bit register load instructions. While this delays the second data load one cycle more that the other techniques described above, this speculative load would still begin before complete calculation of the look up table index and provide a speed up benefit to the algorithm.

Figure 21:
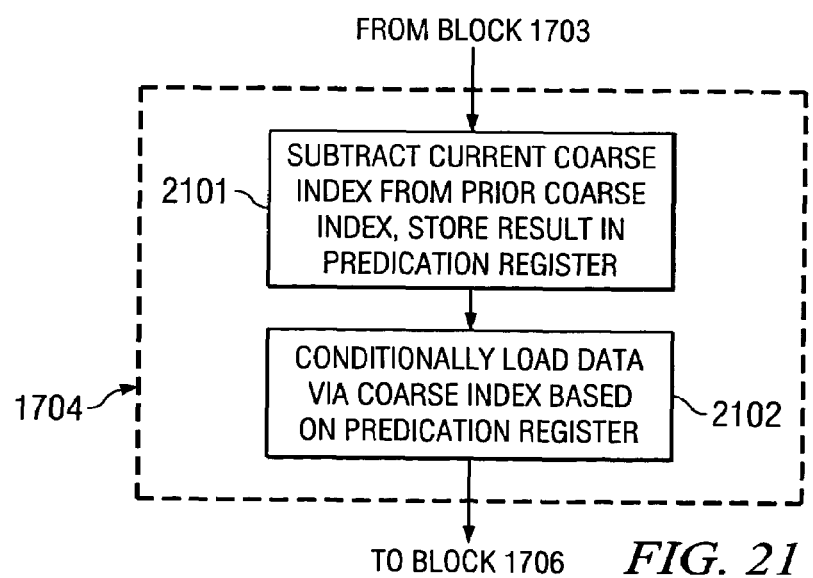
FIG. 21 illustrates in fragmentary flow chart form an alternative to the load data operation based on the coarse index illustrated in FIG. 17.

FIG. 21 illustrates a further variation on the load operation of processing block 1704. Processing block 2101 subtracts the current coarse index from the prior coarse index and stores the result in a register that may be used as a predicate register capable of controlling a later conditional operation (See Table 1). The load operation of processing block 1802 is made conditional on this predicate register being non-zero using a z bit of 0. Thus this load is skipped if the predicate register is zero, indicating that the current coarse index equals the prior coarse index. In this case the look up table entries corresponding to this coarse index are already loaded. Skipping this load reduces power consumption and eliminates any delay due to cache-related stalls. Accessing data at the same coarse index is very likely in entropy coding whose statistics tend to be correlated over time. Bypassing an unnecessary register load absorbs this time locality into the register cached data. This variation requires an extra compare operation. In many cases this extra operation can be performed in parallel with other operations, such as while the fine index defined data is extracted. Note that this compare operation does not need to be adjacent to the conditional load, it only needs to be in the same iteration of the loop.

Following receipt of the requested data (processing block 1704) and calculation of the fine index (processing block 1705), the method selects the data specified by the fine index from the speculatively loaded data (processing block 1706). There are several methods for performing this section selection. The appropriate register form of the section selection instruction such as illustrated in FIGS. 5 to 8 could be employed. The calculated fine index is converted into the corresponding section pointer data and stored in the register specified by the scr1/cst field. Use of the immediate constant form is disadvantageous because selection of the section to be extracted requires a particular instruction coding. The particular instruction needed could generally only be selected by conditional branching. Conditional branching involves pipeline problems of the same type at the memory load latency.

The TMS320C6400 includes an extract and zero-extend a bit field instruction that can perform the extract function. A field in the data register specified by the src2 field is extracted and zero extended to 32 bits. The extract is performed by a shift left followed by an unsigned shift right. The extract and zero-extend a bit field instruction includes a register form and a constant form. In the constant form, the left and right shift amounts are specified by immediate constants in instruction fields. This constant form is not useful in this method because the exact data to be extracted is not known initially. The register form can be used in this method. The csta amount of the left shift is coded in bits 5 to 9 of the data register specified by the scr1 field. The cstb amount of the unsigned right shift is specified by bits 0 to 4 of the data register specified by the scr1 field. Following calculation of the fine index (processing block 1705), a register is loaded with the appropriate data to execute the desired data extraction.

FIG. 22 illustrates the operation of this instruction in an example having a 12 bit left shift and a 23 bit right shift. Input data word 2210 specified by the scr2 field and shown at FIG. 22a) includes section 2200 to be extracted. Left shift amount 2211 specified by csta is the bit distance from the most significant bit of section 2200 to bit 31. Right shift amount 2212 is cstb. As shown in FIG. 22a) the amount cstb-csta is the bit distance from the least significant bit of section 2200 to bit 0. Intermediate data word 2220 illustrated at FIG. 22b) shows section 2200 left shifted to the most significant bits. Final data word 2230 illustrated at FIG. 22c) shows section 2200 right shifted to the least significant bits. This right shift zero fills the most significant bits. All other bits of the input data word 2210 are lost.

The left and right shift amounts for a particular byte or halfword selection used in this algorithm is given below in Table 10.

TABLE 10

| Section Selection | Left Shift Amount | Register bits 5 to 9 | Right Shift Amount | Register bits 0 to 4 |
| --- | --- | --- | --- | --- |
| Byte A | 24 bits | 11000 | 24 bits | 11000 |
| Byte B | 16 bits | 10000 | 24 bits | 11000 |
| Byte C | 8 bits | 00100 | 24 bits | 11000 |
| Byte D | 0 bits | 00000 | 24 bits | 11000 |
| Halfword A | 16 bits | 01000 | 16 bits | 01000 |
| Halfword B | 0 bits | 00000 | 16 bits | 01000 |

In using this extract instruction in this method the right shift amount is a constant. This constant is based on the extracted data length. As shown in Table 10, when selecting a byte the right shift amount is always 24 and when selecting halfwords the right shift amount is always 16.

The appropriate section of data can also be extracted using a right shift instruction followed by a masking operation. The method stores in a data register a right shift amount corresponding to the determined look up table entry. The right shift instruction includes a source field pointing to the data register storing this right shift amount. The right shift amount for a particular byte or halfword selection is given below in Table 11.

TABLE 11

| Section Selection | Right Shift Amount |
| --- | --- |
| Byte A | 0 bits |
| Byte B | 8 bits |
| Byte C | 16 bits |
| Byte D | 24 bits |
| Halfword A | 0 bits |
| Halfword B | 16 bits |

The masking operation would AND the right shifted data with "00000011" hex for byte data and with "00001111" hex for halfword data. This AND operation would result in the selected section being right justified in the resultant register with the other bits zero filled. These instructions are typically more widely available in data processors than the section select instruction described in conjunction with FIGS. 4 to 8 or the extract and zero-extend a bit field instruction described in conjunction with FIG. 22.

Note that both these later techniques operation on single data words only. In the event that extraction from a doubleword is required, the algorithm must make a preliminary selection of the data register storing the appropriate data word before applying these techniques.

The look up table data permits decoding of the current symbol (processing block 1707). The method tests to determine if there is more data to decode (decision block 1708). If there is more data to decode (Yes at decision block 1708), then the method returns to processing block 1702 to consider the next data. If there is no more data to decode (No at decision block 1708), then the method ends at end block 1709.

The method of this invention rather than waiting to determine the exact byte or half-word index prior to loading the look up table entry, loads a word or doubleword around the entry of interest. This speeds the process because the value is loaded ahead of time bypassing some or all of the memory latencies. The ability to select a byte, halfword from this pre-loaded data in the selection section instruction further improves the performance of the algorithm. This can be used to hold small portions of lookup tables and is a minor variant of the existing extract instruction.

This invention solves the problem of memory latency through the use of a simple instruction to cut down on the memory dependency typically associated with the longer pipelines. By using the wide load width, one can view this as an early issued low level pre-fetch to register file. Logical operations which typically have no latency on VLIW and conventional DSP architectures are used for the fine index selection.

This invention permits some benefits with the existing data processing. Existing instructions make it possible to select a byte from a word in 3 cycles. However the proposed section select move instruction enables this operation in one cycle and provides the ability to choose a byte from a doubleword. This invention can be used to enhance the performance of context based arithmetic decoding.

What is claimed is:

1. A data processing apparatus comprising:
   a data register file including a plurality of data registers for storing data, said plurality of data registers of said data register file denominated by register number;
   an execution unit having
      an input connected to said data register file,
      a multiplexer having a plurality of inputs receiving data from bits of corresponding equally sized sections of contiguous bits of said input of said input of said execution unit, an output and a select input, said multiplexer coupling data from a selected one of said plurality of inputs corresponding to said select input to said output, and
      an output having a contiguous section of least significant bits connected to said output of said multiplexer; and
   an instruction decode unit responsive to received instructions including at least one section select register move instruction, each section select register move instruction including a first source register field, a second source register field, a destination register field and each section select register move instruction having a selected one of an immediate constant form and a register form, said instruction decode unit responsive to a received section select register move instruction to
      supply data from a first one of said plurality of data registers denominated by a register number of said first source register field to said input of said execution unit,
      supply a predetermined set of bits of said second source register field to said select input of said multiplexer if said section select register move instruction has said immediate form,
      supply a predetermined set of bits of one of said plurality of data registers denominated by a register number of said second source register field to said select input of said multiplexer if said section select register move instruction has said register form, and
      store data at said output of said execution unit in a third one of said plurality of data registers denominated by a register number of said destination register field.

2. The data processing apparatus of claim 1, wherein:
   said input includes two sections of contiguous bits;
   said instruction decode unit is responsive to a received section select register move instruction having said immediate form to
      supply a select input to said multiplexer to select a first section of said input upon a first coding of said predetermined set of bits of said second source register field, and
      supply a select input to said multiplexer to select a second section of said input upon a second coding of said predetermined set of bits of said second source register field.

3. The data processing apparatus of claim 1, wherein:
   said input includes four sections of contiguous bits;
   said instruction decode unit is responsive to a received section select register move instruction having said immediate form to
      supply a select input to said multiplexer to select a first section of said input upon a first coding of said predetermined set of bits of said second source register field,
      supply a select input to said multiplexer to select a second section of said input upon a second coding of said predetermined set of bits of said second source register field,
      supply a select input to said multiplexer to select a third section of said input upon a third coding of said predetermined set of bits of said second source register field, and
      supply a select input to said multiplexer to select a fourth section of said input upon a fourth coding of said predetermined set of bits of said second source register field.

4. The data processing apparatus of claim 1, wherein:
   said input includes two sections of contiguous bits;
   said instruction decode unit is responsive to a received section select register move instruction having said register form to
      supply a select input to said multiplexer to select a first section of said input upon a first coding of said predetermined set of bits of said data register denominated by said register number of said second source register field, and
      supply a select input to said multiplexer to select a second section of said input upon a second coding of said predetermined set of bits of said data register denominated by said register number of said second source register field.

5. The data processing apparatus of claim 1, wherein:
   said input includes four sections of contiguous bits;
   said instruction decode unit is responsive to a received section select register move instruction having said register form to
      supply a select input to said multiplexer to select a first section of said input upon a first coding of said predetermined set of bits of said data register denominated by said register number of said second source register field, supply a select input to said multiplexer to select a second section of said input upon a second coding of said predetermined set of bits of said data register denominated by said register number of said second source register field, supply a select input to said multiplexer to select a third section of said input upon a third coding of said predetermined set of bits of said data register denominated by said register number of said second source register field, and supply a select input to said multiplexer to select a fourth section of said input upon a fourth coding of said predetermined set of bits of said data register denominated by said register number of said second source register field.

6. A data processing apparatus comprising:

a data register file including a plurality of data registers for storing data, said plurality of data registers of said data register file denominated by register number;

an execution unit having an input connected to said data register file, a multiplexer having a plurality of inputs receiving data from bits of corresponding equally sized sections of contiguous bits of said input of said input of said execution unit, an output and a select input, said multiplexer coupling data from a selected one of said plurality of inputs corresponding to said select input to said output, and an output having a contiguous section of least significant bits connected to said output of said multiplexer; and an instruction decode unit responsive to received instructions including at least one section select register move instruction, each section select register move instruction including a first source register field designating a first register number, a second source register field designating a second register number and a destination register field designating a third register number, said instruction decode unit responsive to a received section select register move instruction to supply data from data from a first one of said plurality of data registers having a register number equal to said first register number to said input of said execution unit, supply a predetermined set of bits from a second one of said plurality of data registers having a register number equal to of said second register number to said select input of said multiplexer, and store data at said output of said execution unit in a third one of said plurality of data registers having a register number equal to said third register number.

7. The data processing apparatus of claim 6, wherein:

said input includes two sections of contiguous bits;

said instruction decode unit is responsive to a received section select register move instruction to supply a select input to said multiplexer to select a first section of said input if said predetermined set of bits of said second data register stores first data, and supply a select input to said multiplexer to select a second section of said input if said predetermined set of bits of said second data register stores second data.

8. The data processing apparatus of claim 6, wherein:

said input includes four sections of contiguous bits;

said instruction decode unit is responsive to a received section select register move instruction to supply a select input to said multiplexer to select a first section of said input if said predetermined set of bits of said second data register stores first data, supply a select input to said multiplexer to select a second section of said input if said predetermined set of bits of said second data register stores second data, supply a select input to said multiplexer to select a third section of said input if said predetermined set of bits of said second data register stores third data, and supply a select input to said multiplexer to select a fourth section of said input if said predetermined set of bits of said second data register stores fourth data.

9. A data processing apparatus comprising:

a data register file including a plurality of data registers for storing data, said plurality of data registers of said data register file denominated by register number;

an execution unit having a first input connected to said data register file, a second input connected to said data register file, a multiplexer having a plurality of inputs receiving data from bits of corresponding equally sized sections of contiguous bits of said first and second inputs of said input of said execution unit, an output and a select input, said multiplexer coupling data from a selected one of said plurality of inputs corresponding to said select input to said output, and an output having a contiguous section of least significant bits connected to said output of said multiplexer; and an instruction decode unit responsive to received instructions including at least one section select register move instruction, each section select register move instruction including a first source register field designating a first register number, a second source register field designating a second register number and a destination register field designating a third register number, said instruction decode unit responsive to a received section select register move instruction to supply data from a first one of said plurality of data registers having a register number equal to said first register number to said first input of said execution unit, p2 supply data from a second one of said plurality of data registers having a register number corresponding to said first register number to said second input of said execution unit, supply instruction specified data to said select input of said multiplexer, and store data at said output of said execution unit in a third one of said plurality of data registers having a register number equal to said third register number.

10. The data processing apparatus of claim 9, wherein:

said data register having a register number corresponding to said first register number of said first source register field is a data register denominated by a next sequential register number.

11. A data processing apparatus comprising:

a data register file including a plurality of data registers for storing data, said plurality of data registers of said data register file denominated by register number;

an execution unit having a first input connected to said data register file, a second input connected to said data register file, a multiplexer having a plurality of inputs receiving data from bits of corresponding equally sized sections of contiguous bits of said first and second inputs of said input of said execution unit, an output and a select input, said multiplexer coupling data from a selected one of said plurality of inputs corresponding to said select input to said output, and an output having a contiguous section of least significant bits connected to said output of said multiplexer;

an instruction decode unit responsive to received instructions including at least one section select register move instruction, each section select register move instruction including a first source register field designating a first register number, an immediate data field designating one of said plurality of sections and a destination register field designating a second register number, said instruction decode unit responsive to a received section select register move instruction to supply data from a first one of said plurality of data registers having a register number equal to said first register number to said first input of said execution unit, supply data from a second one of said plurality of data registers having a register number corresponding to said first register number to said second input of said execution unit, supply a predetermined set of bits of said immediate data field to said select input of said multiplexer, and store data at said output of said execution unit in one of said plurality of data registers having a register number equal to said second register number.

12. The data processing apparatus of claim 11, wherein:

said first and second inputs each include two sections of contiguous bits;

said instruction decode unit is responsive to a received section select register move instruction to supply a select input to said multiplexer to select a first section of said first input upon a first coding of said predetermined set of bits of said immediate data field, supply a select input to said multiplexer to select a second section of said first input upon a second coding of said predetermined set of bits of said immediate data field, supply a select input to said multiplexer to select a first section of said second input upon a third coding of said predetermined set of bits of said immediate data field, and supply a select input to said multiplexer to select a second section of said second input upon a fourth coding of said predetermined set of bits of said immediate data field.

13. The data processing apparatus of claim 11, wherein:

said first and second inputs each include four sections of contiguous bits;

said instruction decode unit is responsive to a received section select register move instruction to supply a select input to said multiplexer to select a first section of said first input upon a first coding of said predetermined set of bits of said immediate data field, supply a select input to said multiplexer to select a second section of said first input upon a second coding of said predetermined set of bits of said immediate data field, supply a select input to said multiplexer to select a third section of said first input upon a third coding of said predetermined set of bits of said immediate data field, supply a select input to said multiplexer to select a fourth section of said first input upon a fourth coding of said predetermined set of bits of said immediate data field, supply a select input to said multiplexer to select a first section of said second input upon a fifth coding of said predetermined set of bits of said immediate data field, supply a select input to said multiplexer to select a second section of said second input upon a sixth coding of said predetermined set of bits of said immediate data field, supply a select input to said multiplexer to select a third section of said second input upon a seventh coding of said predetermined set of bits of said immediate data field, and supply a select input to said multiplexer to select a fourth section of said second input upon an eighth coding of said predetermined set of bits of said immediate data field.

14. A data processing apparatus comprising:

a data register file including a plurality of data registers for storing data, said plurality of data registers of said data register file denominated by register number;

an execution unit having a first input connected to said data register file, a second input connected to said data register file, a multiplexer having a plurality of inputs receiving data from bits of corresponding equally sized sections of contiguous bits of said first and second inputs of said input of said execution unit, an output and a select input, said multiplexer coupling data from a selected one of said plurality of inputs corresponding to said select input to said output, and an output having a contiguous section of least significant bits connected to said output of said multiplexer; and an instruction decode unit responsive to received instructions including at least one section select register move instruction, each section select register move instruction including a first source register field designating a first register number, a second source register field designating a second register number and a destination register field designating a third register number, said instruction decode unit responsive to a received section select register move instruction to supply data from a first one of said plurality of data registers having a register number equal to said first register number to said first input of said execution unit, supply data from a second one of said plurality of data registers having a register number corresponding to said first register number to said second input of said execution unit, supply a predetermined set of bits from a third one of said plurality of data registers having a register number equal to of said second register number to said select input of said multiplexer, and store data at said output of said execution unit in a fourth one of said plurality of data registers having a register number equal to said third register number.

15. The data processing apparatus of claim 14, wherein:

said input includes two sections of contiguous bits;

said instruction decode unit is responsive to a received section select register move instruction to supply a select input to said multiplexer to select a first section of said first input if said predetermined set of bits of said third data register stores first data,
supply a select input to said multiplexer to select a second section of said first input if said predetermined set of bits of said third data register stores second data,
supply a select input to said multiplexer to select a first section of said second input if said predetermined set of bits of said third data register stores third data, and
supply a select input to said multiplexer to select a second section of said second input if said predetermined set of bits of said third data register stores fourth data.

16. The data processing apparatus of claim 14, wherein:
said first and second inputs each include four sections of contiguous bits;
said instruction decode unit is responsive to a received section select register move instruction to
supply a select input to said multiplexer to select a first section of said first input if said predetermined set of bits of said third data register stores first data,
supply a select input to said multiplexer to select a second section of said first input if said predetermined set of bits of said third data register stores second data,
supply a select input to said multiplexer to select a third section of said first input if said predetermined set of bits of said third data register stores third data,
supply a select input to said multiplexer to select a fourth section of said first input if said predetermined set of bits of said third data register stores fourth data,
supply a select input to said multiplexer to select a first section of said second input if said predetermined set of bits of said third data register stores fifth data,
supply a select input to said multiplexer to select a second section of said second input if said predetermined set of bits of said third data register stores sixth data,
supply a select input to said multiplexer to select a third section of said second input if said predetermined set of bits of said third data register stores seventh data, and
supply a select input to said multiplexer to select a fourth section of said second input if said predetermined set of bits of said third data register stores eighth data.

17. A data processing apparatus comprising:
a data register file including a plurality of data registers for storing data, said plurality of data registers of said data register file denominated by register number;
an execution unit having
an input connected to said data register file,
an output, and
a plurality of multiplexers, each having a plurality of inputs receiving data from bits of corresponding equally sized sections of contiguous bits of said input of said input of said execution unit, an output and a select input, each multiplexer coupling data from a selected one of said plurality of inputs corresponding to said select input to a corresponding section of contiguous bits of said output, and
an instruction decode unit responsive to received instructions including at least one section select register move instruction, each section select register move instruction including a first source register field designating a first register number, a second source register field designating a second register number and a destination register field designating a third register number, said instruction decode unit responsive to a received multiple section select register move instruction to
supply data from a first one of said plurality of data registers having a register number equal to said first register number to said input of said execution unit,
supply data from predetermined sets of bits of corresponding sections of a second one of said plurality of data registers having a register number equal to said second register number to said select input of corresponding multiplexers, and
store data at said output of said execution unit in a third one of said plurality of data registers having a register number equal to said third register number.

18. The data processing apparatus of claim 17, wherein:
said input includes two sections of contiguous bits;
said instruction decode unit is responsive to a received multiple section select register move instruction to
supply a select input to each of said plurality of multiplexers to select a first section of said input if said predetermined set of bits of said corresponding section of said second data register stores first data, and
supply a select input to each of said plurality of multiplexers to select a second section of said input if said predetermined set of bits of said corresponding section of said second data register stores second data.

19. The data processing apparatus of claim 17, wherein:
said input includes four sections of contiguous bits;
said instruction decode unit is responsive to a received multiple section select register move instruction to
supply a select input to each of said plurality of multiplexers to select a first section of said input if said predetermined set of bits of said corresponding section of said second data register stores first data,
supply a select input to each of said plurality of multiplexers to select a second section of said input if said predetermined set of bits of said corresponding section of said second data register stores second data,
supply a select input to each of said plurality of multiplexers to select a third section of said input if said predetermined set of bits of said corresponding section of said second data register stores third data, and
supply a select input to each of said plurality of multiplexers to select a fourth section of said input if said predetermined set of bits of said corresponding section of said second data register stores fourth data.

20. The data processing apparatus of claim 17, wherein:
said execution unit supplies 0 to all bits of a section of said output if said predetermined set of bits of said corresponding section of said second data register an all 0 special code.

21. The data processing apparatus of claim 17, wherein:
said execution unit supplies 1 to all bits of a section of said output if said predetermined set of bits of said corresponding section of said second data register an all 1 special code.

22. The data processing apparatus of claim 17, wherein:
said execution unit supplies a bit equal to a most significant bit of a next less significant section to all bits of a section of said output if said predetermined set of bits of said corresponding section of said second data register stores a sign extend special code.

23. A data processing apparatus comprising:

a data register file including a plurality of data registers for storing data, said plurality of data registers of said data register file denominated by register number;

an execution unit having
 a first input connected to said data register file,
 a second input connected to said data register file,
 an output, and
 a plurality of multiplexers, each having a plurality of inputs receiving data from bits of corresponding equally sized sections of contiguous bits of said first and second inputs of said input of said execution unit, an output and a select input, each multiplexer coupling data from a selected one of said plurality of inputs corresponding to said select input to a corresponding section of contiguous bits of said output, and an instruction decode unit responsive to received instructions including at least one section select register move instruction, each section select register move instruction including a first source register field designating a first register number, a second source register field designating a second register number and a destination register field designating a third register number, said instruction decode unit responsive to a received multiple section select register move instruction to
 supply data from a first one of said plurality of data registers having a register number equal to said first register number to said first input of said execution unit,
 supply data from a second one of said plurality of data registers having a register number corresponding to said first register number to said second input of said execution unit,
 supply data from said predetermined sets of bits of corresponding sections of a third one of said plurality of data registers having a register number equal to said second register number to said select input of corresponding multiplexers, and
 store data at said output of said execution unit in a fourth one of said plurality of data registers having a register number equal to said third register number.

24. The data processing apparatus of claim 23, wherein:
said data register having a register number corresponding to said first register number of said first source register field is a data register denominated by a next sequential register number.

25. The data processing apparatus of claim 23, wherein:
said first and second inputs each include two sections of contiguous bits;
said instruction decode unit is responsive to a received multiple section select register move instruction to
 supply a select input to each of said plurality of multiplexers to select a first section of said first input if said predetermined set of bits of corresponding section of said third data register stores first data,
 supply a select input to each of said plurality of multiplexers to select a second section of said first input if said corresponding section of said third data register stores second data,
 supply a select input to each of said plurality of multiplexers to select a first section of said second input if said predetermined set of bits of corresponding section of said third data register stores third data, and
 supply a select input to each of said plurality of multiplexers to select a second section of said second input if said predetermined set of bits of corresponding section of said third data register stores fourth data.

26. The data processing apparatus of claim 23, wherein:
said input includes four sections of contiguous bits;
said instruction decode unit is responsive to a received multiple section select register move instruction to
 supply a select input to each of said plurality of multiplexers to select a first section of said first input if said predetermined set of bits of said corresponding section of said third data register stores first data,
 supply a select input to each of said plurality of multiplexers to select a second section of said first input if said predetermined set of bits of said corresponding section of said third data register stores second data,
 supply a select input to each of said plurality of multiplexers to select a third section of said first input if said predetermined set of bits of said corresponding section of said third data register stores third data,
 supply a select input to each of said plurality of multiplexers to select a fourth section of said first input if said predetermined set of bits of said corresponding section of said third data register stores fourth data,
 supply a select input to each of said plurality of multiplexers to select a first section of said second input if said predetermined set of bits of said corresponding section of said third data register stores fifth data,
 supply a select input to each of said plurality of multiplexers to select a second section of said second input if said corresponding section of said second data register stores sixth data,
 supply a select input to each of said plurality of multiplexers to select a third section of said second input if said predetermined set of bits of said corresponding section of said third data register stores seventh data, and
 supply a select input to each of said plurality of multiplexers to select a fourth section of said second input if said predetermined set of bits of said corresponding section of said third data register stores eighth data.

27. The data processing apparatus of claim 23, wherein:
said execution unit supplies 0 to all bits of a section of said output if said said predetermined set of bits of corresponding section of said third data register stores an all 0 special code.

28. The data processing apparatus of claim 23, wherein:
said execution unit supplies 1 to all bits of a section of said output if said predetermined set of bits of said corresponding section of said third data register stores an all 1 special code.

29. The data processing apparatus of claim 23, wherein:
said execution unit supplies a bit equal to a most significant bit of a next less significant section to all bits of a section of said output if said predetermined set of bits of said corresponding section of said third data register stores a sign extend special code.

* * * * *